(12) United States Patent
Shih et al.

(10) Patent No.: US 7,778,072 B2
(45) Date of Patent: Aug. 17, 2010

(54) METHOD FOR FABRICATING CHARGE-TRAPPING MEMORY

(75) Inventors: Yen-Hao Shih, Hsinchu (TW); Jung-Yu Hsieh, Hsinchu (TW); Yi-Lin Yang, Hsinchu (TW); Chia-Hua Chang, Hsinchu (TW); Jenn-Gwo Hwu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 684 days.

(21) Appl. No.: 11/460,497

(22) Filed: Jul. 27, 2006

(65) Prior Publication Data

US 2008/0025087 A1 Jan. 31, 2008

(51) Int. Cl.
*G11C 11/34* (2006.01)

(52) U.S. Cl. ............... 365/185.01; 365/185.26; 438/694

(58) Field of Classification Search ............ 365/185.1, 365/185.13, 185.26, 174, 85.13; 438/694, 438/758
See application file for complete search history.

(56) References Cited

U.S. PATENT DOCUMENTS 6,048,766 A * 4/2000 Gardner et al. ............. 438/257
6,103,572 A * 8/2000 Kirihara .................... 438/257
6,265,230 B1 * 7/2001 Aggarwal et al. ............ 438/3
6,545,309 B1 4/2003 Kuo
6,750,157 B1 * 6/2004 Fastow et al. ............. 438/786
6,812,507 B2 11/2004 Kuo et al.
6,849,504 B2 2/2005 Chang et al.
7,087,182 B2 * 8/2006 Weimer ..................... 216/58
2003/0157807 A1 * 8/2003 Weimer ..................... 438/694
2004/0127063 A1 * 7/2004 Shin et al. .................. 438/769
2004/0147137 A1 * 7/2004 Hiraiwa et al. ............. 438/778
2005/0057979 A1 * 3/2005 Mokhlesi et al. ........... 365/199
2006/0145242 A1 * 7/2006 Takagi et al. ............... 257/315
2006/0160281 A1 * 7/2006 Huang ...................... 438/149

* cited by examiner

*Primary Examiner*—Vu A Le
*Assistant Examiner*—Han Yang
(74) *Attorney, Agent, or Firm*—J.C. Patents

(57) ABSTRACT

A manufacturing method of a charge-trapping memory device is provided. This method includes forming a stacked structure having at least a charge-trapping medium. An annealing process in a hydrogen gas is then performed on the stacked structure subsequent to the device fabrication process. The annealing process is conducted at a temperature of about 350° C. to 450° C. and with the concentration of the hydrogen gas greater than 0.5 mole percent.

14 Claims, 5 Drawing Sheets

METHOD FOR FABRICATING CHARGE-TRAPPING MEMORY

BACKGROUND OF THE INVENTION

1. Field of Invention

The present invention relates to a method for fabricating a semiconductor device. More particularly, the present invention relates to a method for fabricating a charge-trapping memory.

2. Description of Related Art

Flash memory is a type of non-volatile memory that allows multiple data reading, writing and erasing operations. In addition, the stored data are retained even after power to the device is terminated. With these advantages, flash memory has been broadly applied in personal computers and electronic equipment.

A conventional flash memory is a device having a dual-gate structure, in which a first gate electrode that functions as a floating gate electrode is formed on an oxide film disposed on the surface of a semiconductor substrate, an interlayer insulating film is disposed on the upper surface of the first gate electrode, and a second gate electrode that functions as a control gate electrode is formed on the upper surface of the interlayer insulating film. In the dual-gate structure of this type of memory cell, charges are accumulated in the floating gate, which is made of, for example, polysilicon, and information is stored by altering a threshold voltage of the memory cell according to the accumulated charges therein. To program this type of memory cell, biases are applied to the control gate and the source/drain of the memory cell. An electron flow from the source to the drain produces hot electrons that tunnel through the tunnel oxide layer into the floating gate. The hot electrons are distributed evenly in the floating gate. If a defect occurs in the tunnel oxide film, the charges accumulated in the floating gate are likely to leak out, causing a destruction of the stored data.

To resolve the leakage problem of the flash memory, a charge-trapping layer is developed to replace the polysilicon floating gate in the conventional flash memory. The charge-trapping layer is, for example, a silicon nitride layer formed as a silicon oxide/silicon nitride/silicon oxide (ONO) structure. The memory cell with a stacked gate structure comprising a nitride charge-trapping medium is known as a "nitride read-only memory (NROM)". Due to the highly-compacted nature of the nitride layer, hot electrons tunneling into the silicon nitride layer are trapped to form an unequal concentration distribution and are localized in a region of the silicon nitride layer near the drain with a Gaussian spatial distribution. Because the injected electrons are localized, they are less likely to locate at the defects of the tunnel oxide layer. Hence, a current leakage in the device can be mitigated. Moreover, since the electrons are localized in a region of the charge-trapping layer near the drain, a charge-trapping memory is capable of storing two bits in a single memory cell.

However, during the fabrication of a NROM, for example, in the processing steps of forming additional semiconductor structures or interconnects, the stacked gate structure is exposed to plasma processing, for example, in plasma etching, which causes electrical charges to accumulate on the interconnects due to a phenomenon known as the "antenna effect". The accumulated charges on the interconnects create a voltage difference across the ONO layer of the NROM memory cell. When a transient charge imbalance occurs, charges are injected into the ONO layer such that a wide threshold voltage (Vt) distribution among memory devices is resulted.

In addition to the "antenna effect", the clustering of electrons on the surface of an insulating film may lead to a wide threshold voltage distribution. For example, during the metal interconnect process of a NROM, an insulating layer is formed by a PECVD process to cover the metal lines. However, the plasma used in the PECVD process often causes a clustering of charges on the surface of the insulating layer, wherein these charges travels to the silicon nitride layer in the ONO layer along the metal lines. As a result, a wide threshold voltage distribution among memory devices is resulted.

Moreover, when an ultraviolet (UV) light is used for exposure during a photolithograph process, electron-hole pairs are generated, and some of the electrons diffuse into the charge-trapping layer. Ultimately, a wide threshold voltage distribution among memory devices is resulted.

FIG. 1 is a schematic diagram illustrating the threshold voltage distributions among memory devices that are not being charged versus being charged by plasma or UV light. As shown in FIG. 1, the threshold voltage distribution is narrow and the average threshold voltage is lower when the memory devices are not charged by plasma or UV. On the other hand, the threshold voltage distribution is broader and the average threshold voltage is higher when the memory devices are charged by plasma or UV. A wide distribution of the threshold voltage has serious consequences. For example, if a memory has a wide threshold voltage distribution, the program distribution and erase distribution may overlap with each other, leading to an abnormal function of the memory device.

SUMMARY OF THE INVENTION

In view of the foregoing, the present invention provides a method for tightening a threshold voltage distribution.

The present invention also provides a method for fabricating a charge-trapping memory device, wherein a broad distribution of the threshold voltage (Vt) induced by plasma or ultraviolet (UV) light is tightened and the average threshold voltage is lowered.

According to the fabrication method of a charge-trapping memory device of the present invention, an annealing process is conducted in a hydrogen environment. The unwanted electrons trapped in the charge-trapping layer, charged by plasma or ultraviolet light during the device fabrication process, are eliminated. Ultimately, the wide threshold voltage distribution among devices is narrowed and the average threshold voltage is lowered.

According to the fabrication method of a charge-trapping memory device of the present invention, the annealing process is conducted at a temperature of about 350° C. to about 450° C.

According to the fabrication method of a charge-trapping memory device of the present invention, the hydrogen concentration in the annealing process is at least greater than 0.5% in mole concentration.

According to the fabrication method of a charge-trapping memory device of the present invention, the annealing process is conducted for about 10 minutes.

According to the fabrication method of a charge-trapping memory device of the present invention, the annealing process is conducted subsequent to the metal interconnect process of the charge-trapping memory device.

Since the wide threshold voltage distribution induced by plasma or UV light can be narrowed according to fabrication method of the present invention, data errors encountered in the charge-trapping memory device can be obviated. Moreover, the need for a protecting structure, such as fuse or diode, connecting to the metal line can be eliminated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
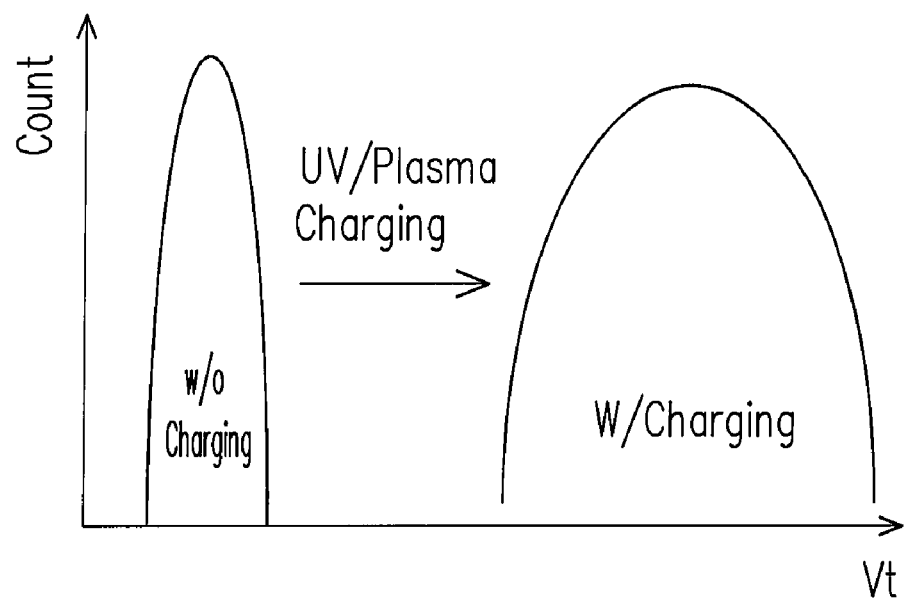
FIG. 1 is a schematic diagram illustrating the threshold voltage distributions among charge-trapping devices that are not being charged versus being charged by plasma or UV light.
Figure 2:
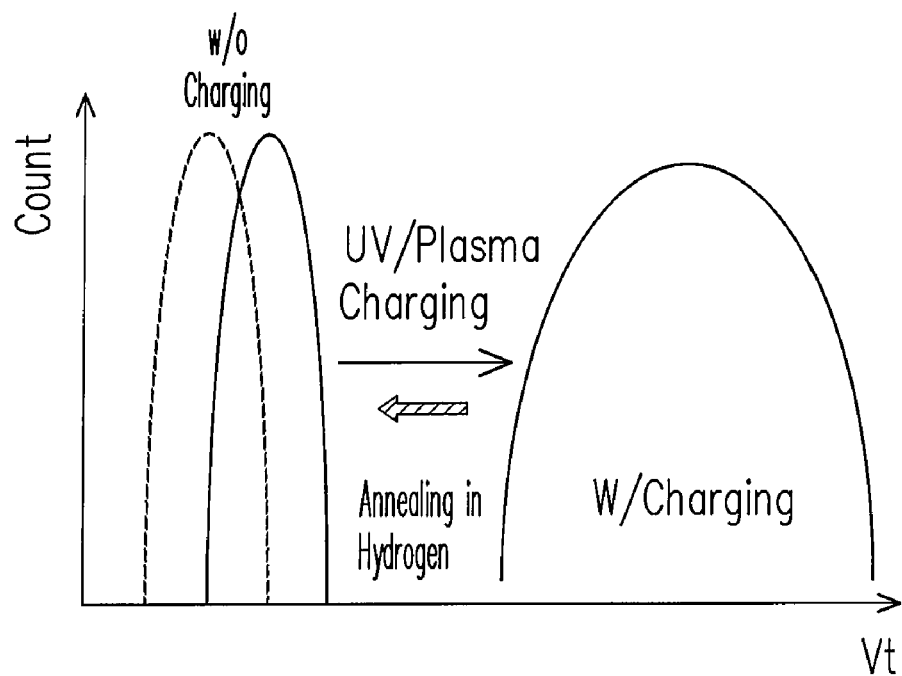
FIG. 2 is a schematic diagram illustrating the threshold voltage distributions among charged memory devices before versus after the performance of an annealing process in hydrogen gas, and the threshold voltage distributions among uncharged memory devices.

A wide threshold voltage distribution among devices may result due to unwanted electrons trapped in the charge-trapping medium. The charge-trapping medium with the unwanted electrons is charged by, for example plasma or ultraviolet light (UV) used in the device fabrication process. According to the method of the present invention for tightening a threshold voltage distribution of plasma or UV charged devices, an annealing process is conducted in hydrogen gas at about 350° C. to about 450° C. More preferably, the annealing process is conducted at about 400° C. Further, the annealing process may conduct with pure or diluted hydrogen gas. When the annealing process is conducted with diluted hydrogen gas, the hydrogen concentration is at least greater than 0.5 mole percent. More preferably, the hydrogen concentration is about 10 mole percent. As shown in FIG. 2, FIG. 2 is a schematic diagram illustrating the threshold voltage distributions among charged memory devices before versus after the performance of an annealing process in hydrogen gas, and the threshold voltage distributions among uncharged memory devices. As shown in FIG. 2, not only the distribution of the threshold voltage among the charged devices can be tightened according to the annealing process of the present invention, the threshold voltages of the devices can also be lowered significantly.

Figure 3:
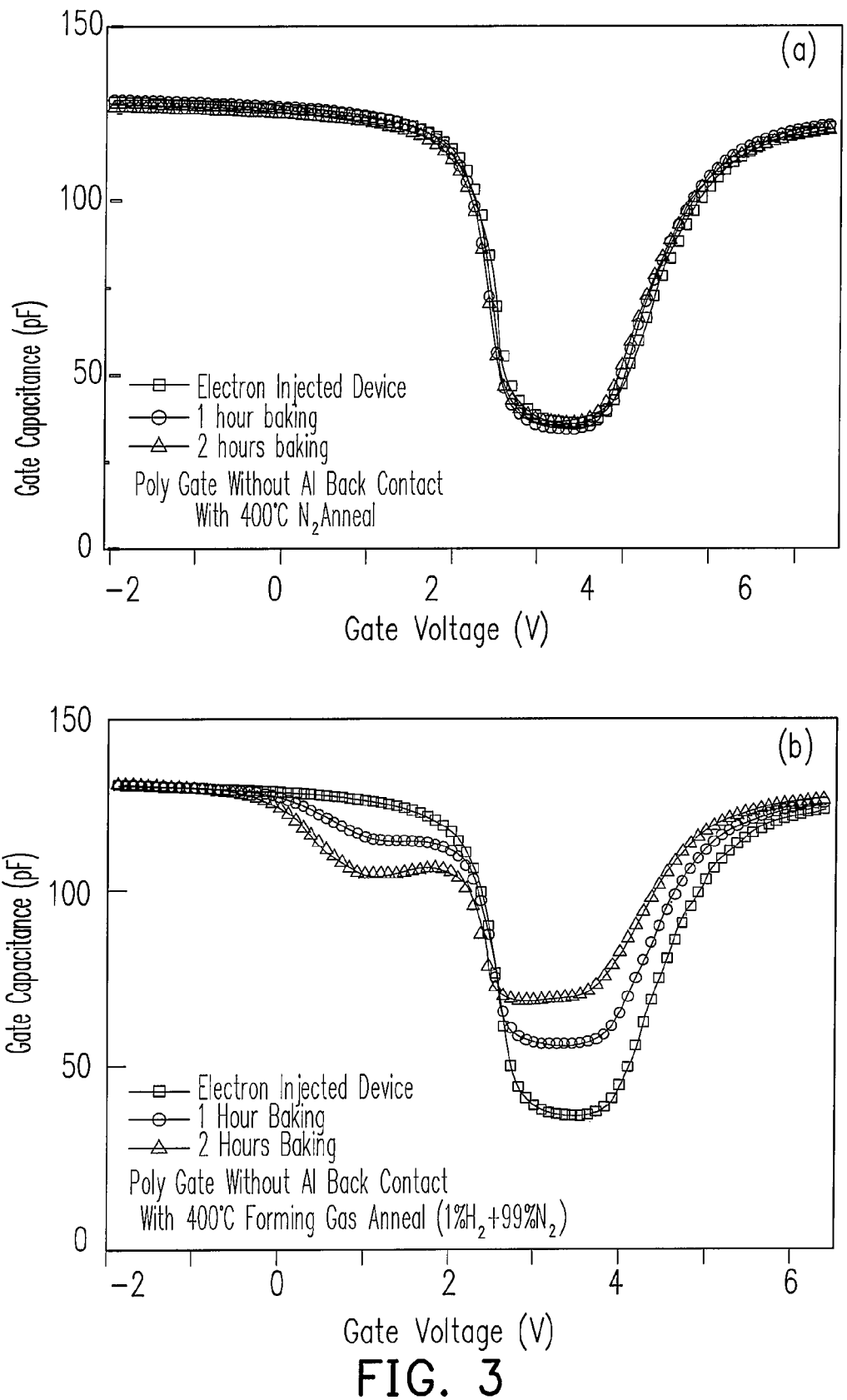
FIGS. 3a and 3b are graphs showing the relationship of gate capacitance (pF) and gate voltage (V) of a charge-trapping device after the charge-trapping device is respectively subjected to an annealing process at 400° C. in nitrogen gas and in 1 mole percent of hydrogen gas at 400° C.

FIGS. 3a and 3b are graphs showing the relationship of gate capacitance (pF) and gate voltage (V) of a charge-trapping device after the charge-trapping device is subjected to an annealing process at 400° C. in nitrogen gas and in 1 mole percent of hydrogen gas at 400° C., respectively. The charge-trapping device is initially charged by plasma or ultraviolet light, for example. As shown in FIG. 3a, there is no change in the behavior of the gate capacitance when the annealing process is conducted in nitrogen gas. In fact, the behavior of the gate capacitance remains unchanged after 1 or 2 hours of baking. However, as shown in FIG. 3b, the behavior of the gate capacitance changes dramatically when the annealing process is conducted in 1 mole percent of hydrogen gas. The behavior of the gate capacitance shown in FIG. 3b suggests that there are charge losses at the edges of the charge-trapping medium.

Figure 4:
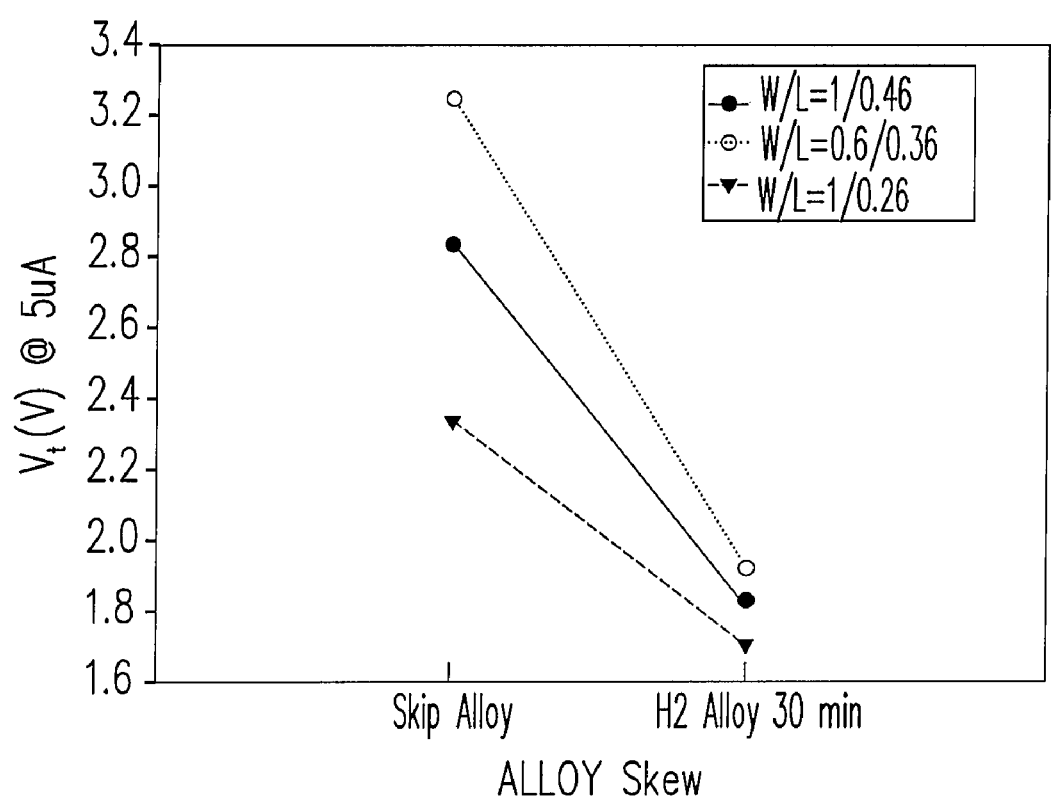
FIG. 4 is a graph showing the distributions of the threshold voltages among various charge-trapping devices that are being subjected to versus not being subjected to an annealing process of the present invention.

FIG. 4 is a graph showing the distributions of the threshold voltages among various charge-trapping devices that are being subjected to versus not being subjected to an annealing process of the present invention. These charge-trapping devices are initially charged by plasma or UV light, for example. In this example, the annealing process is conducted in hydrogen gas for about 30 minutes. As shown in FIG. 4, the threshold voltages of the charge-trapping devices range from about 2.3 volts to about 3.3 volts when the annealing process is not performed. However, after subjecting the various charge-trapping devices to the annealing process in hydrogen gas for about 30 minutes, the threshold voltages of the various devices ranges from 1.7 volts to 1.9 volts. Hence, it is obvious that the threshold voltage distribution has narrowed significantly after subjecting the charged devices to an annealing process of the present invention. Moreover, the threshold voltages of the devices are also lowered significantly.

The following Table 1 summarizes the measurements of flat-band voltages of two samples of a charge-trapping device under various conditions.

|  | Initial Vfb | After Charging | After 5 hour baking at 350° C. and 1% $H_2$ |
|---|---|---|---|
| Sample 1 | −1 V | 2.8 V | 1.0 V |
| Sample 2 | −1 V | 5 V | 1.1 V |

As shown in Table 1, the initial flat-band voltages of the two samples of the charge-trapping device are −1 volt. After the samples are charged by, for example, plasma or ultraviolet light, the flat-band voltages increase to 2.8 volts and 5 volts, respectively for the two samples. However, after subjecting the two samples to an annealing process in 1 mole percent of hydrogen gas at 350° C. for about 5 hours, the flat-band voltages of the two samples drop to 1.0 and 1.1 volt, respectively. According to the data shown in Table 1, not only the distribution of the threshold voltages among the samples can be tightened according to the annealing process of the present invention, the threshold voltage of the device can also be lowered significantly.

Referring now to FIGS. 5A to 5E, wherein FIGS. 5A to 5E are schematic, cross-sectional views showing selected process steps for fabricating a charge-trapping memory device according to one embodiment of the present invention.

Figure 5A:
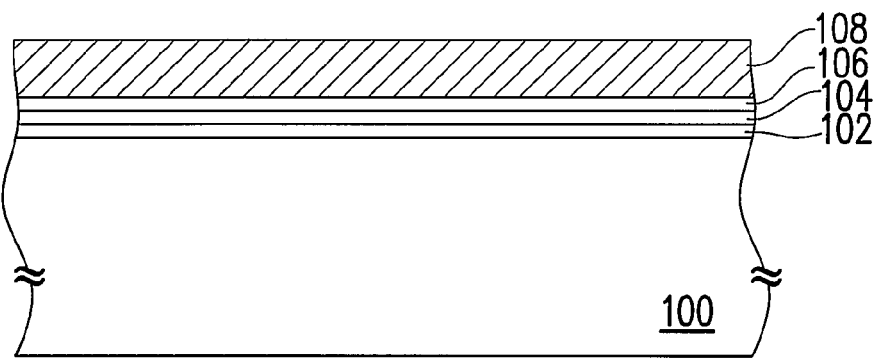
FIGS. 5A to 5E are schematic, cross-sectional views showing selected process steps for fabricating a charge-trapping memory device according to one embodiment of the present invention.

As shown in FIG. 5A, a tunneling layer 102, a trapping layer 104 and a barrier layer 106 are sequentially formed on a substrate 100. The tunneling layer 102 is formed with, for example, silicon oxide. A material of the trapping layer 104 includes nitrides, but also may include, for example but not limited to oxynitride, hafnium oxide, aluminate oxide, the silicate thereof or other materials having similar properties. The barrier layer 106 is, for example, an oxide layer.

A gate conductive layer 108 is then formed on the barrier layer 106. The gate conductive layer 108 may include a polysilicon layer. In one embodiment, the gate conductive layer 108 may also include a metal silicide layer formed on the polysilicon layer. The gate conductive layer 108 is formed by chemical vapor deposition, for example. In the case that a metal silicide layer is also formed as the gate conductive layer 108, the metal silicide layer may form by forming a metal layer on the polysilicon layer, followed by performing a thermal process to induce a reaction between the metal layer and the polysilicon layer so as to form the metal silicide layer.

Figure 5B:
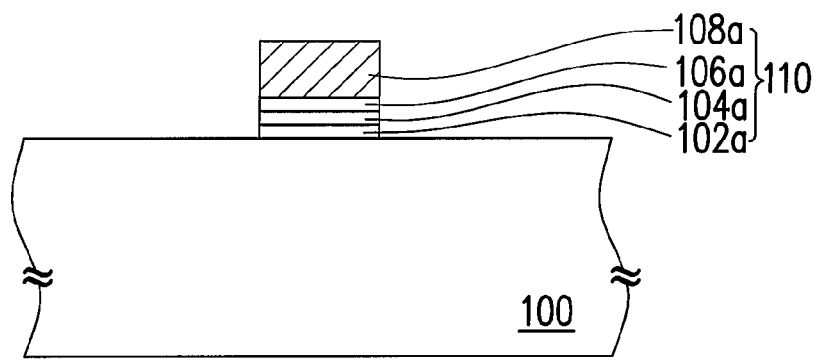

Referring to FIG. 5B, using a patterned photoresist layer (not shown) as an etching mask, an etching process is performed to pattern the tunneling layer 102, the trapping layer 104, the barrier layer 106 and the gate conductive layer 108. Ultimately, a stacked structure 110 that includes the tunneling layer 102a, the trapping layer 104a, the barrier layer 106a and the gate conductive layer 108a is formed. In this embodiment of the invention, the gate conductive layer 108a serves as a control gate of the memory device.

Figure 5C:
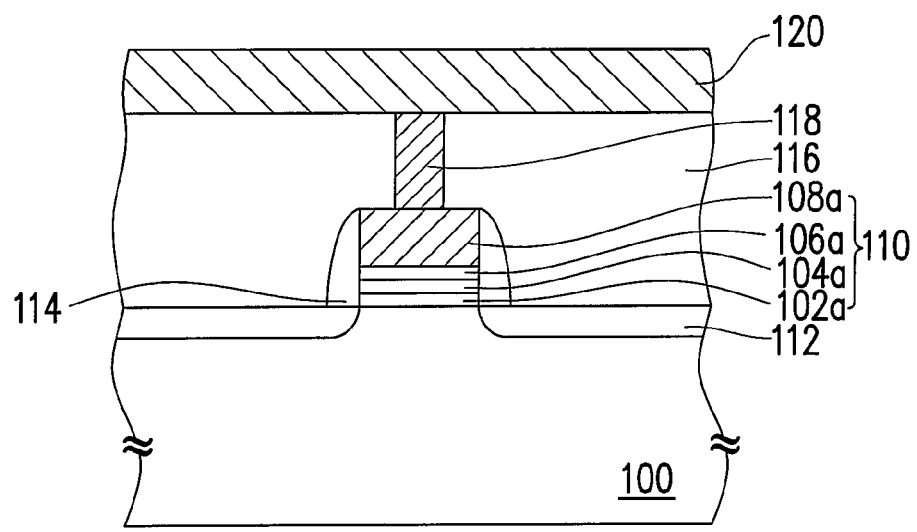

Referring to FIG. 5C, a source/drain region 112 is formed in the substrate 100 beside the sides of the stacked structure 110. Further, an insulating spacer 114 is formed on the sidewall of the stacked structure 110. The insulating spacer 114 is formed by, for example, forming a dielectric layer (not shown) over the stacked structure 110, followed by performing an etching back process on the dielectric layer. The material of the dielectric layer includes but not limited to silicon oxide.

A metal interconnect process may perform subsequent to the processing steps in forming the stacked structure 110. Still referring to FIG. 5C, an inter-layer dielectric layer 116 is formed over the substrate 100, covering the stacked structure 110. The inter-layer dielectric layer 116 is formed by performing a plasma enhanced chemical vapor deposition (PECVD) process, for example. A contact 118 is further formed in the inter-layer dielectric layer 116. A metal layer 120 is subsequently formed on the dielectric layer 116 and the contact 118.

Figure 5D:
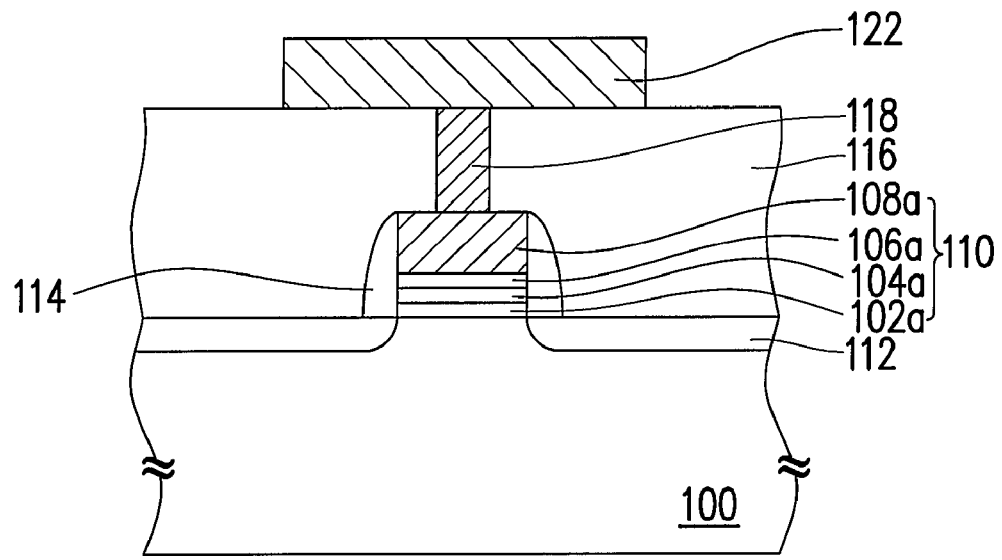

Continuing to FIG. 5D, the metal layer 120 is patterned to form a patterned conductive structure 122. The patterned conductive structure 122 is electrically connected to the stacked structure 110. The metal layer 120 is patterned by performing photolithography and etching processes.

Figure 5E:
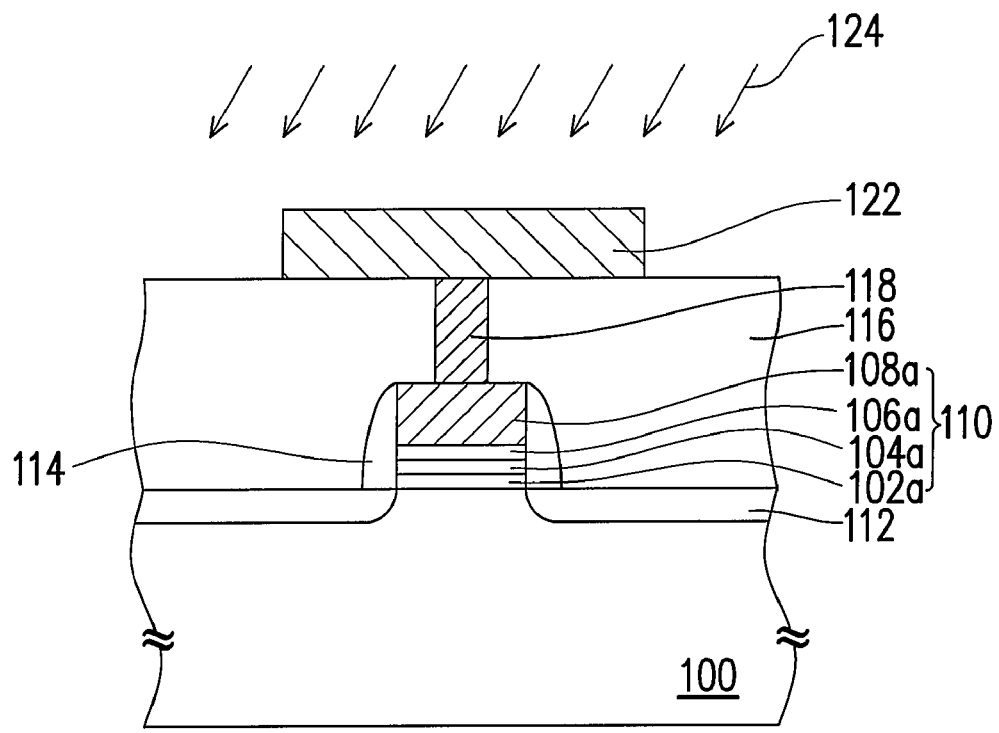

Now referring to FIG. 5E, wherein FIG. 5E illustrates a process step of an annealing process 124 in hydrogen gas. The annealing process 124 is performed on the aforementioned device structure. The annealing process is conducted, for example, in a furnace set at a temperature of about 350° C. to about 450° C.; and preferably at about 400° C. The annealing process is conducted in pure or diluted hydrogen gas. If the annealing process is conducted with diluted hydrogen gas, the hydrogen concentration is at least greater than 0.5 mole percent. In one preferred embodiment, the hydrogen concentration is set at about 10 mole percent. Moreover, the annealing process is conducted for about 10 minutes or more.

Since the application of plasma and ultraviolet light take place during the metal interconnect process subsequent to the fabrication of the stacked gate structure, unwanted charges are being trapped by the trapping layer. As a result, the threshold voltage distribution among memory devices is broadened and the average threshold voltage is increased. By performing the annealing process in hydrogen gas, the unwanted charges in the trapping layer can be eliminated. Consequently, the wide threshold voltage distribution among memory devices is tightened and the threshold voltage of the device is lowered. Additionally, the application for a protecting structure, such as fuse or diode, connecting to the metal line can be obviated.

Although the disclosure herein refers to the fabrication process of a charge-trapping device, it is to be understood that the method for tightening the wide distribution of threshold voltage of the present invention is applicable in other processes with UV/plasma charging issues.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for fabricating a charge-trapping memory, the method comprising:
   providing a substrate with a stacked structure having at least a gate conductive layer and a charge trapping medium;
   forming a metal interconnect structure above the stacked structure;
   performing thereafter an annealing process in a hydrogen gas with a concentration greater than 0.5 mole percent to eliminate unwanted charges in the charge-trapping memory.

2. The method of claim 1, wherein the annealing process is conducted at about 350° C. to about 450° C.

3. The method of claim 1, wherein the annealing process is conducted at about 400° C.

4. The method of claim 1, wherein the hydrogen gas is pure hydrogen gas.

5. The method of claim 1, wherein the concentration of the hydrogen gas is about 10 percent.

6. The method of claim 1, wherein the charge-trapping medium comprises an oxide layer-storage layer-oxide layer structure.

7. The method of claim 1, wherein the charge-trapping medium comprises a material selected from the group consisting of nitride, oxynitride, hafnium oxide, aluminate oxide and silicates thereof.

8. A method for fabricating a charge-trapping memory, wherein the method comprising:
   forming a stack structure comprising a tunneling layer, a charge trapping layer, a barrier layer and a gate conductive layer on a substrate;
   forming an insulating layer over the substrate covering the stack structure, wherein the insulating layer comprises at least a contact therein;
   forming a metal layer on the insulating layer and the contact;
   performing a photolithography process to pattern the metal layer to form a conducting line structure; and
   performing an annealing process in a hydrogen gas with a concentration greater than 0.5 mole percent to eliminate unwanted charges in the charge-trapping memory.

9. The method of claim 8, wherein the annealing process is conducted at a temperature of about 350° C. to about 450° C.

10. The method of claim 8, wherein the annealing process is conducted at about 400° C.

11. The method of claim 8, wherein the hydrogen gas is pure hydrogen gas.

12. The method of claim 8, wherein the charge-trapping layer is formed with a material selected from the group consisting of nitride, oxynitride, hafnium oxide, aluminate oxide and silicates thereof.

13. The method of claim 8, wherein the insulating layer is formed by performing a plasma enhanced chemical vapor deposition process.

14. The method of claim 8, wherein the photolithography process comprises an application of an ultraviolet light.

* * * * *